United States Patent
Katsap

(10) Patent No.: US 10,553,388 B1
(45) Date of Patent: Feb. 4, 2020

(54) HIGH-BRIGHTNESS LANTHANUM HEXABORIDE CATHODE AND METHOD FOR MANUFACTURING OF CATHODE

(71) Applicants: NuFlare Technology, Inc., Kanagawa (JP); NuFlare Technology America, Inc., Sunnyvale, CA (US)

(72) Inventor: Victor Katsap, Cornwall, NY (US)

(73) Assignees: NuFlare Technology, Inc., Kanagawa (JP); NuFlare Technology America, Inc., Sunnyvale, CA (US)

(*) Notice: Subject to any disclaimer, the term of this patent is extended or adjusted under 35 U.S.C. 154(b) by 0 days.

(21) Appl. No.: 16/203,407

(22) Filed: Nov. 28, 2018

(51) Int. Cl.
| H01J 1/148 | (2006.01) |
| H01J 1/22 | (2006.01) |
| H01J 37/075 | (2006.01) |
| H01J 9/04 | (2006.01) |

(52) U.S. Cl.
CPC ............... *H01J 1/148* (2013.01); *H01J 1/22* (2013.01); *H01J 9/04* (2013.01); *H01J 37/075* (2013.01); *H01J 2237/06308* (2013.01)

(58) Field of Classification Search
CPC ...... H01J 1/148; H01J 9/04; H01J 1/22; H01J 37/075; H01J 2237/06308
See application file for complete search history.

(56) References Cited

U.S. PATENT DOCUMENTS

| 4,200,555 | A | * | 4/1980 | Joy | .................. C04B 35/5156 |
| | | | | | 252/519.14 |
| 4,468,586 | A | * | 8/1984 | Hohn | .................. H01J 37/06 |
| | | | | | 313/336 |
| 7,176,610 | B2 | | 2/2007 | Katsap | |
| 9,165,737 | B2 | | 10/2015 | Katsap | |
| 9,240,301 | B1 | * | 1/2016 | Mackie | .................. H01J 1/148 |
| 2018/0005791 | A1 | * | 1/2018 | Schultz | .................. H01J 1/3044 |

FOREIGN PATENT DOCUMENTS

JP  2011146250 A * 7/2011 ............. H01J 1/15

* cited by examiner

*Primary Examiner* — Donald L Raleigh
(74) *Attorney, Agent, or Firm* — Oblon, McClelland, Maier & Neustadt, L.L.P.

(57) ABSTRACT

A thermionic cathode, an electron emission apparatus, and a method of fabricating the thermionic cathode are provided. The thermionic cathode includes an emitter. The emitter includes a lanthanum hexaboride ($LaB_6$) crystal having a crystallographic orientation of (310). The operating temperature of the thermionic cathode is greater than 1800 K.

3 Claims, 5 Drawing Sheets

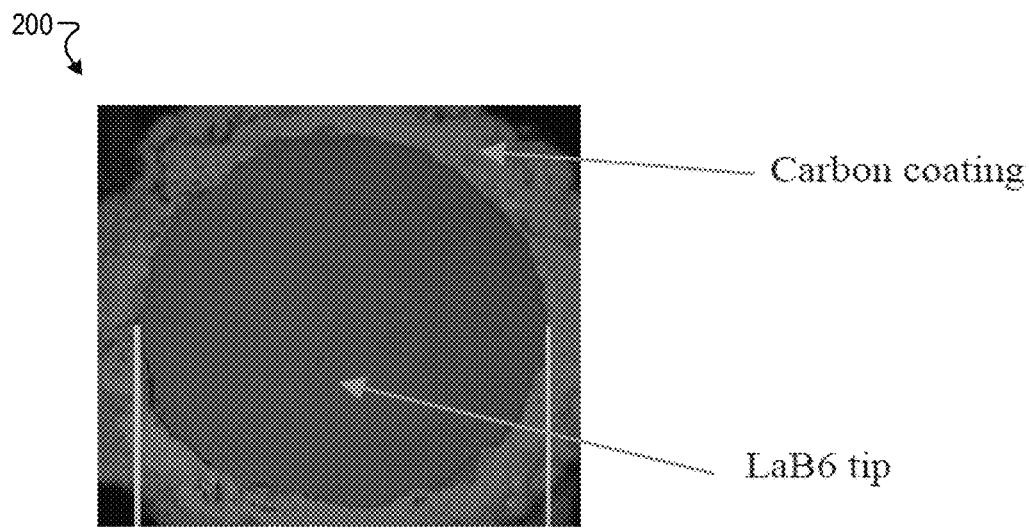
FIG. 2
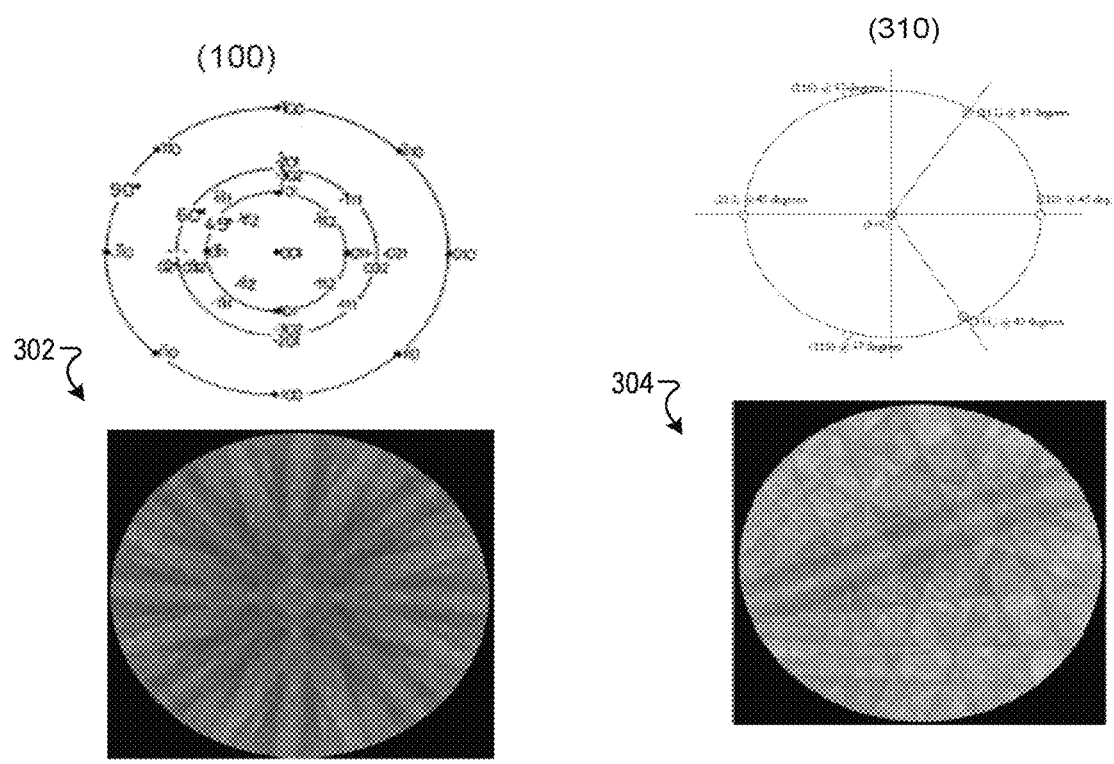
FIG. 3A
FIG. 3B

HIGH-BRIGHTNESS LANTHANUM HEXABORIDE CATHODE AND METHOD FOR MANUFACTURING OF CATHODE

BACKGROUND

1. Field

This invention generally relates to a thermionic cathode. In particular, the invention provides a cathode in which a lanthanum hexaboride (LaB$_6$) crystal having a crystallographic orientation of (310) is used.

2. Background

In shaped beam lithography tools, a 50 keV (kilo electronvolt) electron beam irradiates a thin layer of resist on the top of a quartz substrate. Resist exposure is achieved by the electrons colliding with resist molecules. After exposure, developing, and etching steps, a photomask is made.

Existing e-beam lithography tools (e.g., lithographic tools, probes, free electron lasers, and electron and ion guns) and characterization tools (e.g., scanning electron microscopes (SEMs) and transmission electron microscopes (TEMs)) use cathodes primarily made of lanthanum hexaboride (LaB$_6$) or cerium hexaboride (CeB$_6$), in sintered or crystalline form having a crystallographic orientation of (100).

These cathodes, however, have disadvantages. Emitter material evaporates with a rate that depends on temperature and vacuum pressure. Brightness is proportional to the operating temperature and to the emission current density. At typical operating temperatures (1650K to 1900K (Kelvin)), LaB$_6$ crystalline material evaporates at the rate of several microns per 100 hours, which limits the cathode's useful life. Generally, the higher the operating temperature, the faster the evaporation rate. The effect of this evaporation is the eventual loss of tip structure and the end of the cathode's useful lifetime. Thus, increasing the operating temperature to increase brightness leads to a decrease in the cathode's lifetime due to the faster evaporation rate. Further, brightness is inversely proportional to a workfunction of a material. In other words, a material having a lower workfunction has a higher brightness at an operating temperature compared to a material having a higher workfunction.

Existing cathodes have a short lifetime due to the high operating temperature. Accordingly, what is needed, as recognized by the present inventor, is a cathode that can provide high brightness at a lower temperature and therefore having an extended lifetime while maintaining a high source brightness.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

The present disclosure relates to a thermionic cathode including an emitter. The emitter includes a lanthanum hexaboride (LaB$_6$) crystal having a crystallographic orientation of (310). The operating temperature of the thermionic cathode is greater than 1800 K.

The present disclosure also relates to an electron emission apparatus. The electron emission apparatus includes a thermionic cathode, a heat source, and a support. The emitter includes a lanthanum hexaboride (LaB$_6$) crystal having a crystallographic orientation of (310). The heat source is operably connected to the thermionic cathode to provide heat to the cathode. The support holds the emitter and the heat source.

The present disclosure also relates to a method of manufacturing a thermionic cathode. The method includes providing an emitter including a lanthanum hexaboride (LaB$_6$) crystal having a crystallographic orientation of (310), and operably connecting the emitter to an emitter heater to provide heat to the emitter.

The foregoing paragraphs have been provided by way of general introduction, and are not intended to limit the scope of the claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 2 is a schematic that shows an image of the cathode according to one example;

FIG. 3A is a schematic that illustrates a crystalline plane and a channeling pattern of a LaB$_6$ crystal having a crystallographic orientation of (100) according to one example;

FIG. 3B is a schematic that illustrates a crystalline plane and a channeling pattern of a LaB$_6$ crystal having a crystallographic orientation of (310) according to one example;

DETAILED DESCRIPTION

Figure 1A:
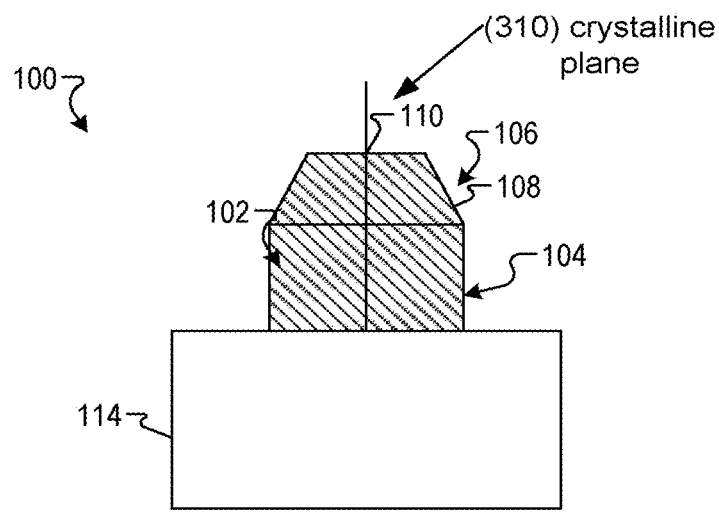
FIG. 1A is a schematic that shows a cross-sectional side view of a cathode according to one example.

Referring now to the drawings, wherein like reference numerals designate identical or corresponding parts throughout several views, the following description relates to an emitter, an apparatus, and associated methodology for electron beam (e-beam) lithography.

The e-beam lithography cathode described herein provides high brightness along with high emittance and a uniform beam profile. The emitter described herein provides a higher current density compared to a lanthanum hexaboride emitter having a crystallographic orientation of (100) at temperatures above 1800K. Conversely, at emission current densities greater than 16 A/cm$^2$, the emitter described herein provides lower operating temperatures compared to an LaB$_6$ emitter having crystallographic orientation of (100). Lower operating temperatures extend the cathode lifetime due to a lower evaporation rate. In addition, higher brightness improves resolution in scanning electron microscopes (SEMs) and transmission electron microscopes (TEMs). In one embodiment, the emitter may be made of lanthanum hexaboride (LaB$_6$) and of a single crystal of aforementioned materials having a crystallographic orientation of (310).

FIG. 1A is a schematic that shows a cross-sectional side view of a cathode 100 according to one example. The cathode 100 includes an emitter 102. The emitter 102 is held in a holder 114 (i.e., support, base, emitter holder). The holder 114 holds the emitter 102 steady in space. The holder 114 functions to hold the emitter 102 in positions suitable for operation. The holder 114 may include elements such as a ferrule directly connected to the emitter 102, a base and/or sub-base (e.g., of ceramic) to which the various elements are connected, various mounting strips, clips, and the like for holding the support element together, as would be understood by one of ordinary skill in the art.

The emitter 102 may be formed using a single crystal, which may or may not be sintered. Sintered materials are those formed from particles that are bonded due to exposure to heat and/or pressure, as recognized by one of ordinary skill in the art. The emitter 102 may be formed using a lanthanum hexaboride (LaB$_6$) crystal having a crystallographic orientation of (310).

The emitter 102 may operate at a temperature greater than 1800 K. The emitter 102 may operate in a range of from about 1830 K to about 1900 K, or in the range of from about 1840 K to about 1900 K, e.g., about 1840 K, 1845 K, 1850 K, 1855 K, 1860 K, 1865 K, 1870 K, 1875 K, 1880 K, 1885 K, 1890 K, 1895 K, or 1900 K.

In one embodiment, the emitter 102 has a main body having a lower part 104 and an upper part 106 (e.g., about the upper 10 μm-200 μm of the emitter crystal). The length of the emitter 102 generally ranges from about 0.50 mm to about 3 mm. The lower part 104 and the upper part 106 are formed integrally. The main body may be of any suitable shape. The main body size and shape may be based on the cathode application (e.g., scanning electron microscopes, transmission electron microscopes, probes, free electron lasers, electron and ion guns) and the type of heat source employed. For example, a Vogel heater requires a rectangular main body. A coaxial heater requires a cylindrical main body shape. The upper part 106 may be conical, cylindrical, square, rectangular, pyramidal, or the like.

A cross section of the lower part 104 is generally round or rectangular with a diameter (or width if rectangular) in the range of from about 20 μm to about 800 μm, or in the range of from about 30 μm to about 250 μm, e.g., about 30, 50, 70, 90, 110, 130, 150, 170, 180, 200, 220, or 250 μm.

In one embodiment, the lower part 104 has a cylindrical shape and has straight sides. The upper part 106 has a conical surface 108 and an electron emitting surface 110 provided at an upper end of the upper part 106. The cathode emitter cone angle may be in the range from about 20 degrees to about 90 degrees, e.g., about 20, 25, 30, 35, 40, 45, 50, 55, 60, 65, 70, 75, 80, 85, or 90 degrees.

The electron emitting surface 110 has an emitting area size of 30 μm to 250 μm in diameter if round depending on the desired degree of truncation and the desired cone angle (or 30 μm to 250 μm in diagonal if square-shaped). In one example, the electron emitting surface 110 has an emitting area size in the range of about 50 μm to about 500 μm, e.g., about 50, 100, 150, 200, 250, 300, 350, 400, 450, or 500 μm.

In the cathode 100 in FIG. 1A, the shape of the electron emitting surface 110 is flat, but it may be curved (e.g., spherical or dome-shaped). The shape of the electron emitting surface 110 may be based on the application.

In one implementation, sidewalls of the emitter 102 may be coated with a non-emissive material for higher practical brightness. The non-emissive coating may be applied on the upper and/or lower part of the emitter 102. For example, a coating is applied to at least an outer surface of the upper part 106 and may encase part or all of the lower part 104. The coating may be formed from any suitable material, examples of which include but are not limited to graphite, colloidal graphite (e.g., aquadag), DLC (diamond-like carbon), pyrolytic carbon, and the like. The choice of carbon coating may depend upon several factors, including but not limited to cost of cathode production, facilities available for carrying out the deposition, and the like. The carbon may be deposited using chemical vapor deposition (CVD), pyrolytic carbon deposition, or the like. A thickness of the carbon coating may be up to 100 μm. In one example, the thickness is in the range from about 8 μm to 10 μm.

Figure 1B:
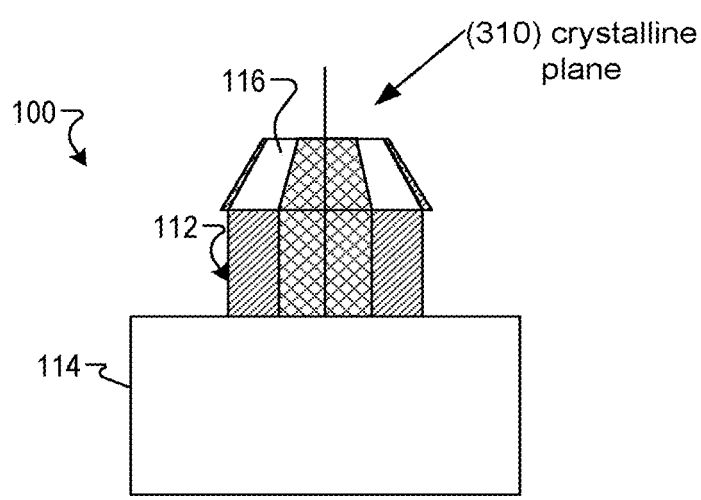
FIG. 1B is a schematic that shows a cross-sectional side view of a cathode including a non-emissive coating according to one example.

FIG. 1B is a schematic that shows a cross-sectional side view of the cathode 100 having a coated emitter according to one example. The coating 112 covers an outer surface of the sides of the lower part 104 and the upper part 106 for the purpose of suppressing evaporation of the emitter 102 to extend the usable time (lifetime) of the cathode 100. The coating 112 may be directly in contact with the LaB$_6$ surface or separated by a gap as disclosed, for example, in U.S. Pat. No. 9,165,737, entitled "HIGH BRIGHTNESS, LONG LIFE THERMIONIC CATHODE AND METHOD OF ITS FABRICATION," the entire disclosure of which is incorporated herein by reference. A gap 116 is between the coating 112 and the upper part 106. The coating 112 may contain inevitable impurities.

FIG. 2 is a schematic that shows an image 200 of the cathode 100 according to one example. The image shows a cross-sectional top view of the cathode 100 having a carbon coated emitter.

FIG. 3A is a schematic that illustrates a crystalline plane and a channeling pattern of a LaB$_6$ crystals having crystallographic orientations of (100). FIG. 3B is a schematic that illustrates a crystalline plane and a channeling pattern of a LaB$_6$ crystals having crystallographic orientations of (310). The crystalline plane 302 associated with a (100) crystallographic orientation shows a 4-fold symmetry. The crystalline plane 304 associated with a (310) crystallographic orientation does not show a 4-fold symmetry.

The cathode 100 may be a part of an electron emission apparatus. For example, the thermionic cathode 100 described herein may be used in electron beam lithography tools, scanning electron microscopes or in any other application where a thermionic cathode might be utilized. The cathode 100 may be operably connected to heat source (i.e., emitter heater) in a manner such that sufficient heat can be provided to the cathode 100 to cause electron emission from the emitter 102. The emitter heater may be a carbon heater rod, a resistive spiral, or the like, as would be understood by one of ordinary skill in the art.

The cathode 100 may be mounted in a high vacuum electron gun chamber. Then, the cathode 100 is heated until an operating temperature greater than 1840 K is reached. A voltage is applied to the anode. The cathode 100 emits electrons having a current density $J_{em}$. The current density defines the cathode brightness. Cathode brightness is critical in many applications (e.g., SEM/TEM) and e-beam lithography.

The current density is a function of an operating temperature of the cathode T and a work function of the crystal of the cathode 100. The current density $J_{em}$ may be related to the operating temperature T and the work function Φ via a Richardson-Dushman formula given by:

$$J_{em} = 80 \times T^2 e^{-\frac{(\Phi + m\Delta T)}{kT}} \quad (1)$$

where m is a workfunction temperature dependence coefficient, ΔT is a temperature difference between a predetermined temperature and the operating temperature T, and k is Boltzmann constant. The predetermined temperature may be 1780 K. The workfunction temperature dependence coefficient is positive for a LaB6 crystal having a crystallographic orientation of (100). Typically, the workfunction temperature dependence coefficient is in a range from 0.2 meV/K to 0.3 meV/K for the crystallographic orientation of (100). The workfunction is typically 2.610 eV at 1780 K for a crystallographic orientation of (100).

The workfunction temperature dependence coefficient for a crystallographic orientation of (310) is negative and is about –0.03 meV/K. The workfunction is typically 2.620 eV at 1780 K.

The temperature is typically increased to increase the current density. For the crystallographic orientation of (100), the current density rise is slowed down by the workfunction increase (i.e., m is positive). However, for the crystallographic orientation of (310), the current density rise is accelerated by the workfunction reduction (i.e., m is negative) with the increase in temperature. The lower the workfunction of the cathode, the greater is the cathode capability of emitting electrons at given temperatures.

Figure 4:
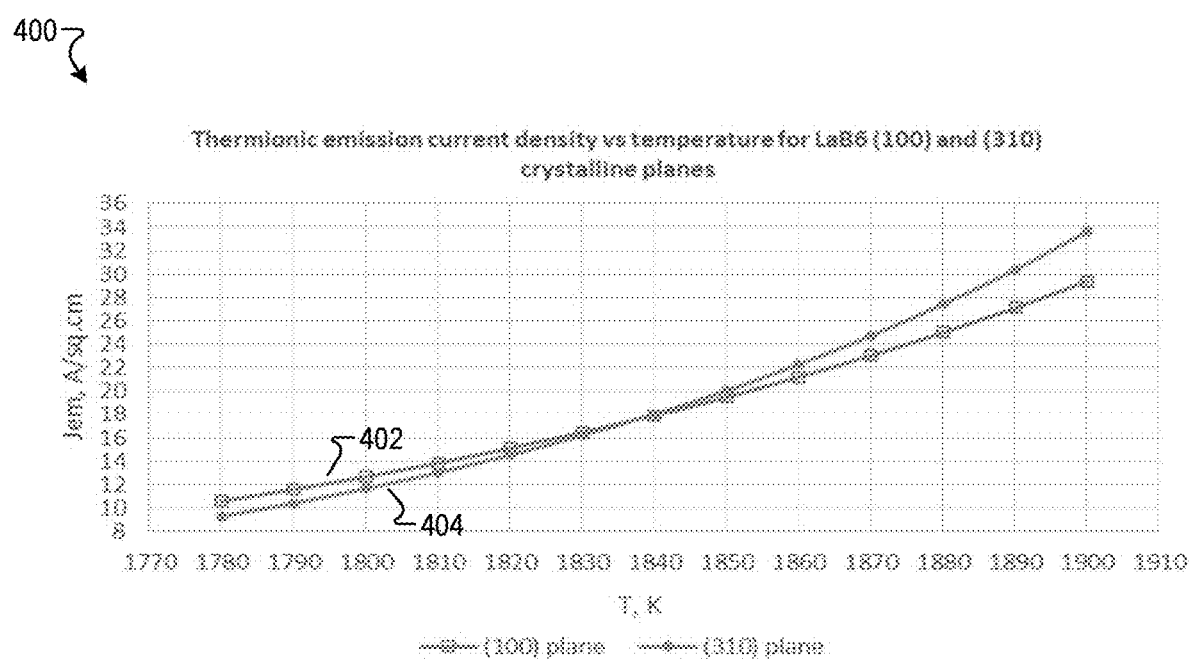
FIG. 4 is a schematic that illustrates emission current density for a lanthanum hexaboride (LaB$_6$) cathode having a crystallographic orientation of (100) and a LaB$_6$ cathode having a crystallographic orientation of (310) as a function of temperature according to one example.

FIG. 4 is a schematic 400 that shows the thermionic emission current density as a function of temperature for a $LaB_6$ crystal having a crystallographic orientation of (100) (trace 402) and a $LaB_6$ having a crystallographic orientation of (310) (trace 404). For temperatures greater than 1840 K, the current density is higher for a crystallographic orientation of (310).

This disclosure also provides methods for making the cathodes described herein. In general, the manufacture of the cathodes described herein is carried out according to methods and steps known in the art. In one embodiment, the methods of fabricating the cathode described herein include, but not limited to, the following steps: providing an emitter made of a $LaB_6$ crystal having an emitter body, a conical portion or section, and a tip; coating the emitter body with a non-emissive coating, and depositing the $LaB_6$ in a (310) crystallographic orientation. In other words, the $LaB_6$ has a crystallographic orientation of (310) in a direction orthogonal to the electron emitting surface 110.

EXAMPLES

Figure 5:
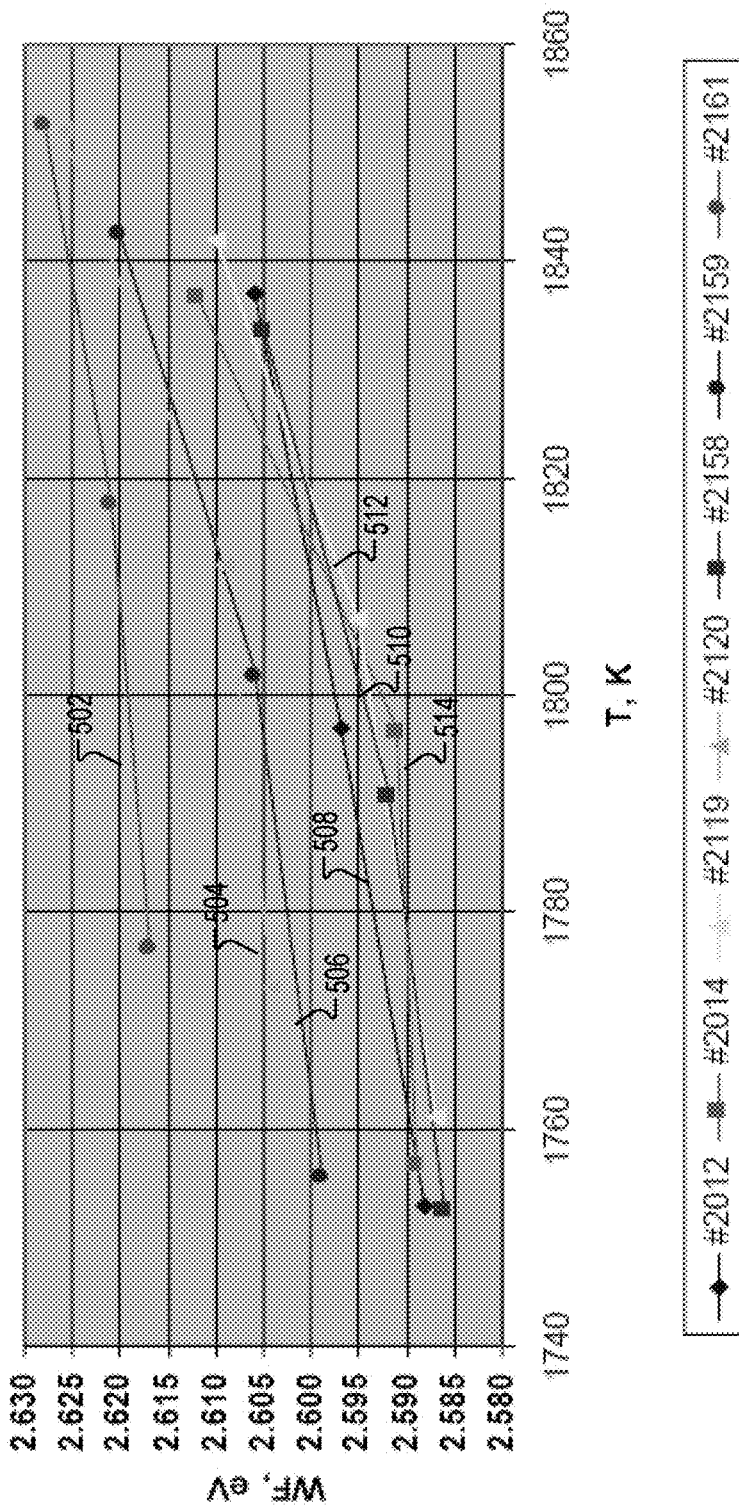
FIG. 5 is a schematic that illustrates the workfunction of cathodes having a crystallographic orientation of (100) as a function of temperature according to one example.

Further studies were undertaken in order to investigate the emitter 102. In a first example, the workfunction of $LaB_6$ crystals having a (100) crystallographic orientation are determined as a function of temperature. The results are shown in FIG. 5 for three test temperatures corresponding to a current density of 7, 11, and 16 A/sq·cm. Trace 502 is for an emitter having a tip diameter (i.e., electron emitting surface) of 53.1 μm diameter and a gap of 8 μm wide with a 90° cone angle. Trace 504 is for an emitter having a tip diameter of 52 μm and a gap of 1 μm wide with a 60° cone angle. Trace 506 is for an emitter having a tip diameter of a 54.6 μm and a gap of 12 μm wide with a 90° cone angle. Trace 508 is for an emitter having a tip diameter of 52 μm and a gap of 4 to 8 μm wide with a 60° cone angle. Trace 510 is for an emitter having a tip diameter of 55.1 μm and a gap of 7 μm wide with a 90° cone angle. Trace 512 is for an emitter having a tip diameter of 54.1 μm and a gap of 2-7 μm wide with a 60° cone angle. Trace 514 is for an emitter having a tip diameter of 54.6 μm and a 8-16 μm wide gap with a 60° cone angle.

The $LaB_6$ cathodes showed low workfunction, especially for temperature below 1800 K. Further, the cathodes showed a positive workfunction dependence (i.e., the workfunction temperature dependence coefficient m is positive). The workfunction temperature dependence coefficient is about 0.30 meV/K. Table 1 shows the workfunction temperature dependence coefficient in the range of about 1740 K to about 1852 K (Full range) and for temperature greater than 1800 K. The workfunction temperature dependence coefficient is about 1.4 greater for temperatures greater than 1800 K (compared to temperature below 1800 K).

TABLE 1

| Cathode ID No. | ΔWF/T (Full range)(meV/K) | ΔWF/T (>1800K) (meV/K) |
| --- | --- | --- |
| 502 | 0.14 | 0.18 |
| 504 | 0.28 | 0.43 |
| 506 | 0.25 | 0.34 |
| 508 | 0.21 | 0.23 |
| 510 | 0.22 | 0.30 |
| 512 | 0.28 | 0.43 |
| 514 | 0.29 | 0.52 |

Eight $LaB_6$ cathodes having a crystallographic orientation of (310) were tested. The test results are shown in table 2.

TABLE 2

| Cathode ID No. | Work function @ Temperature | Work function @ Temperature |
| --- | --- | --- |
| 0557 | 2.615 eV @ 1778K | 2.610 eV @ 1840K |
| 0558 | 2.62 eV @ 1780K | 2.615 eV @ 1840K |
| 0560 | 2.62 eV @ 1780K | 2.623 eV @ 1840K |
| 0561 | 2.611 eV @ 1780K | 2.611 eV @ 1840K |
| 0563 | 2.625 eV @ 1780K | 2.624 eV @ 1820K |
| 0564 | 2.628 eV @ 1780K | 2.625 eV @ 1830K |
| 0567 | 2.615 eV @ 1780K | 2.616 eV @ 1840K |
| 0568 | 2.656 eV @ 1780K | 2.646 eV @ 1839K |

Figure 6:
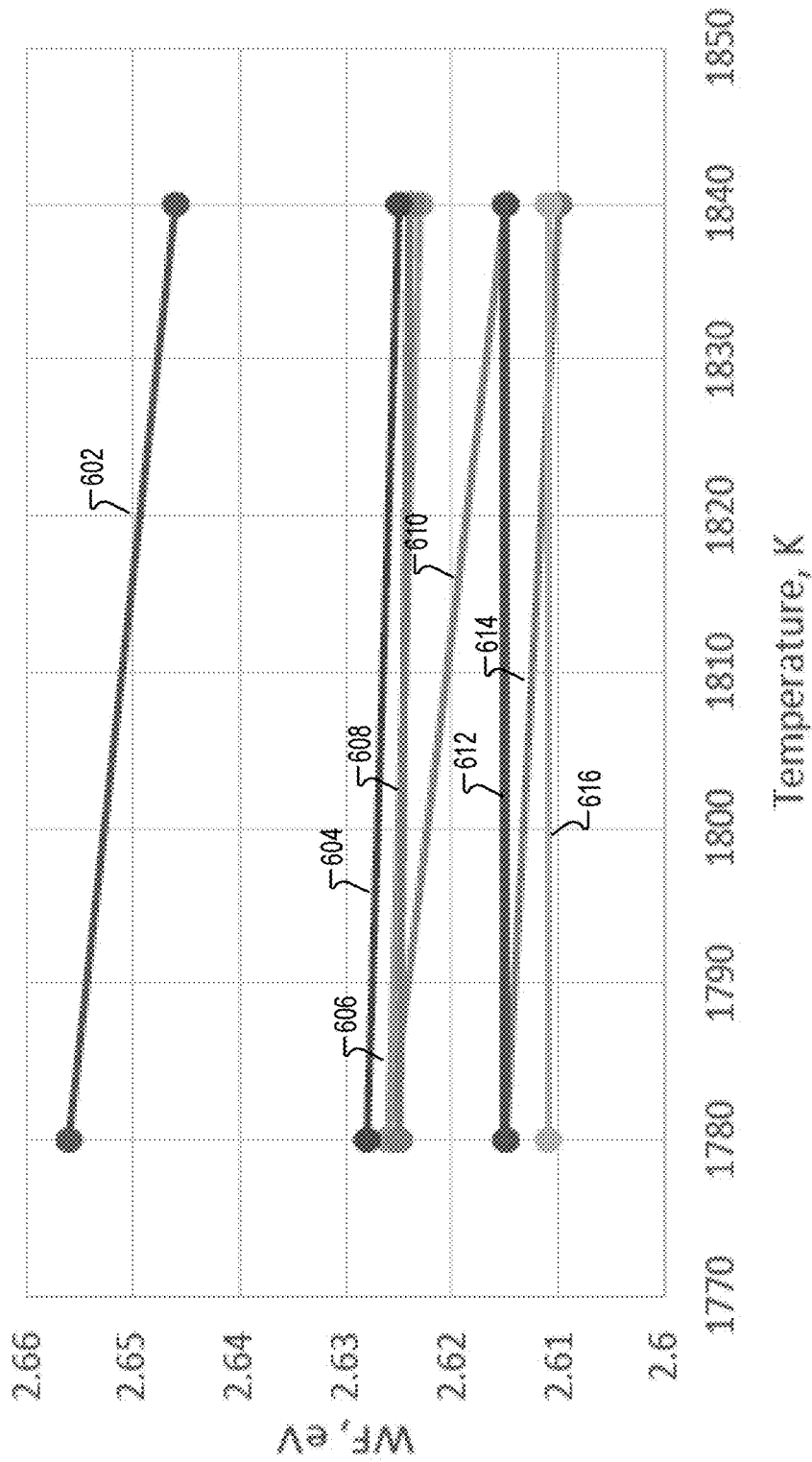
FIG. 6 is a schematic that shows the workfunction of cathodes having a crystallographic orientation of (310) as a function of temperature according to one example.

The test results shown in table 2 are plotted in FIG. 6. Trace 602 is associated with cathode identifier 0568. Trace 604 is associated with cathode identifier 0564. Trace 606 is associated with cathode identifier 0560. Trace 608 is associated with cathode identifier 0563. Trace 610 is associated with cathode identifier 0558. Trace 612 is associated with cathode identifier 0567. Trace 614 is associated with cathode identifier 0557. Trace 616 is associated with cathode identifier 0561. The cathodes show a negative or a flat workfunction slope as a function of temperature. On the other hand, cathodes having a (100) crystallographic orientation shows a positive workfunction of about 0.30 meV/K. For temperatures greater than 1830K, cathodes having a (310) crystallographic orientation have a lower workfunction and a lower operating temperature than cathodes having a (100) crystallographic orientation.

The features of the present disclosure provide a multitude of improvements in the field of e-beam lithography. In particular, the cathode can provide higher brightness at operating temperatures greater than 1830K. LaB6 cathodes with (310) crystallographic orient have the advantage of providing a higher current density. Therefore, the resolution of SEM/TEM and the throughput in e-beam lithography are improved. Further, the cathode described herein is compatible with conventional apparatus (e.g., electron gun). Therefore, the cathode may be interchanged when operating at temperature greater than 1800 K.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for manufacturing a thermionic cathode, comprising:
    providing an emitter made of lanthanum hexaboride ($LaB_6$) crystal having a crystallographic orientation of (310) and having a zero or negative workfunction temperature dependence coefficient;
    operably connecting the emitter to an emitter heater to provide heat to the emitter, wherein an operating temperature of the thermionic cathode is in a range from 1830 K to 1900 K; and
    interchanging the emitter with another emitter made of $LaB_6$ having a crystallographic orientation of (100) when operating at temperature lower than 1800 K.

2. The method of claim 1, further comprising:
    applying a non-emissive coating to an outer surface of sides of the emitter before connecting the emitter to the emitter heater.

3. The method of claim 2, wherein the non-emissive coating is a carbon coating.

* * * * *